United States Patent
Xu et al.

(10) Patent No.: US 11,183,389 B2
(45) Date of Patent: Nov. 23, 2021

(54) FIN FIELD EFFECT TRANSISTOR DEVICES WITH SELF-ALIGNED GATES

(71) Applicant: INTERNATIONAL BUSINESS MACHINES CORPORATION, Armonk, NY (US)

(72) Inventors: Wenyu Xu, Albany, NY (US); Stuart A. Sieg, Albany, NY (US); Ruilong Xie, Niskayuna, NY (US); John R. Sporre, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 19 days.

(21) Appl. No.: 16/353,641

(22) Filed: Mar. 14, 2019

(65) Prior Publication Data
US 2020/0294803 A1 Sep. 17, 2020

(51) Int. Cl.
| H01L 21/28 | (2006.01) |
| H01L 29/66 | (2006.01) |
| H01L 29/78 | (2006.01) |
| H01L 29/49 | (2006.01) |
| H01L 21/3213 | (2006.01) |

(52) U.S. Cl.
CPC .. *H01L 21/28088* (2013.01); *H01L 21/32136* (2013.01); *H01L 29/4966* (2013.01); *H01L 29/66666* (2013.01); *H01L 29/7827* (2013.01)

(58) Field of Classification Search
CPC ............... H01L 21/32136; H01L 21/18088
See application file for complete search history.

(56) References Cited

U.S. PATENT DOCUMENTS

| 5,874,760 | A | 2/1999 | Burns, Jr. et al. |
| 6,034,389 | A | 3/2000 | Burns, Jr. et al. |
| 6,689,650 | B2 | 2/2004 | Gambino et al. |
| 8,470,711 | B2 | 6/2013 | Arnold et al. |
| 9,530,866 | B1 * | 12/2016 | Zhang ................. H01L 29/0676 |
| 9,536,793 | B1 | 1/2017 | Zhang et al. |
| 9,773,708 | B1 * | 9/2017 | Zhang ............... H01L 29/66545 |
| 9,905,424 | B1 | 2/2018 | Law |
| 10,090,411 | B2 | 10/2018 | Basker et al. |
| 2014/0148012 | A1 | 5/2014 | Guillorn et al. |
| 2018/0090388 | A1 | 3/2018 | Anderson et al. |
| 2018/0204931 | A1 | 7/2018 | Reboh et al. |

(Continued)

*Primary Examiner* — Trang Q Tran
(74) *Attorney, Agent, or Firm* — Tutunjian & Bitetto, P.C.; Erik Johnson

(57) ABSTRACT

A method of forming adjacent fin field effect transistor devices is provided. The method includes forming at least two vertical fins in a column on a substrate, depositing a gate dielectric layer on the vertical fins, and depositing a work function material layer on the gate dielectric layer. The method further includes depositing a protective liner on the work function material layer, and forming a fill layer on the protective liner. The method further includes removing a portion of the fill layer to form an opening between an adjacent pair of two vertical fins, where the opening exposes a portion of the protective liner. The method further includes depositing an etch-stop layer on the exposed surfaces of the fill layer and protective liner, forming a gauge layer in the opening to a predetermined height, and removing the exposed portion of the etch-stop layer to form an etch-stop segment.

20 Claims, 11 Drawing Sheets

(56) References Cited

U.S. PATENT DOCUMENTS

2018/0254330 A1    9/2018  Bao et al.
2019/0304841 A1*  10/2019  Sung ............... H01L 21/823821
2020/0168509 A1*  5/2020  Zang ................ H01L 21/32136

* cited by examiner

FIN FIELD EFFECT TRANSISTOR DEVICES WITH SELF-ALIGNED GATES

BACKGROUND

The present invention generally relates to fin field effect transistor (FinFET) devices, and more particularly to gate structures and contacts for FinFETs.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming adjacent fin field effect transistor devices is provided. The method includes forming at least two vertical fins in a column on a substrate. The method further includes depositing a gate dielectric layer on the at least two vertical fins, and depositing a work function material layer on the gate dielectric layer. The method further includes depositing a protective liner on the work function material layer, and forming a fill layer on the protective liner. The method further includes removing a portion of the fill layer to form an opening between an adjacent pair of the at least two vertical fins, where the opening exposes a portion of the protective liner. The method further includes depositing an etch-stop layer on the exposed surfaces of the fill layer and protective liner. The method further includes forming a gauge layer on the etch-stop layer in the opening to a predetermined height, and removing the exposed portion of the etch-stop layer to form an etch-stop segment in the opening.

In accordance with another embodiment of the present invention, a method of forming adjacent fin field effect transistor devices is provided. The method includes forming at least two vertical fins in a column on a substrate, and forming a source/drain region below each of the at least two vertical fins. The method further includes forming a bottom spacer layer on the substrate, and depositing a gate dielectric layer on the at least two vertical fins and bottom spacer layer. The method further includes depositing a work function material layer on the gate dielectric layer, and depositing a protective liner on the work function material layer. The method further includes forming a fill layer on the protective liner, and removing a portion of the fill layer to form an opening between an adjacent pair of the at least two vertical fins, where the opening exposes a portion of the protective liner. The method further includes depositing an etch-stop layer on the exposed surfaces of the fill layer and protective liner, and forming a gauge layer on the etch-stop layer in the opening to a predetermined height. The method further includes removing the exposed portion of the etch-stop layer to form an etch-stop segment in the opening, and forming a top source/drain on each of the adjacent pair of the at least two vertical fins.

In accordance with yet another embodiment of the present invention, an adjacent pair of fin field effect transistor devices is provided. The adjacent pair of fin field effect transistor devices includes two adjacent vertical fins in a column on a substrate, and a source/drain region below each of the two adjacent vertical fins. The devices further include a bottom spacer layer on the substrate, and a gate dielectric layer on the two adjacent vertical fins and bottom spacer layer. The devices further include a work function material layer on the gate dielectric layer, and a protective liner on the work function material layer. The devices further include an etch-stop segment on the protective liner between the two adjacent fins, and a top source/drain on each of the two adjacent fins.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a self-aligned gate with a self-aligned spacer and work function layer in the narrow space between adjacent vertical fins. Overlap between a protective layer and the top surface of the vertical fins and fin template can be avoided by allowing a full etch-back of the protective liner, work function layer, and gate dielectric layer.

Embodiments of the present invention provide a method of forming a self-aligned gate structure by protecting the work function layer of the gate structure with an etch-stop layer connecting the ends of vertical fins. The etch-stop layer can protect the covered portion of the work function layer on the fin sidewalls, fin end, and an area on the bottom horizontal surface during etch-back of the protective liner, work function layer, and gate dielectric layer from the top portion of the vertical fins and bottom horizontal surface.

Exemplary applications/uses to which the present invention can be applied include, but are not limited to: logic devices (e.g., NAND .gates, NOR, gates, XOR gates, etc.) and memory devices (e.g., static random access memory (SRAM) and dynamic random access memory (DRAM)).

It is to be understood that aspects of the present invention will be described in terms of a given illustrative architecture; however, other architectures, structures, substrate materials and process features and steps can be varied within the scope of aspects of the present invention.

Figure 1:
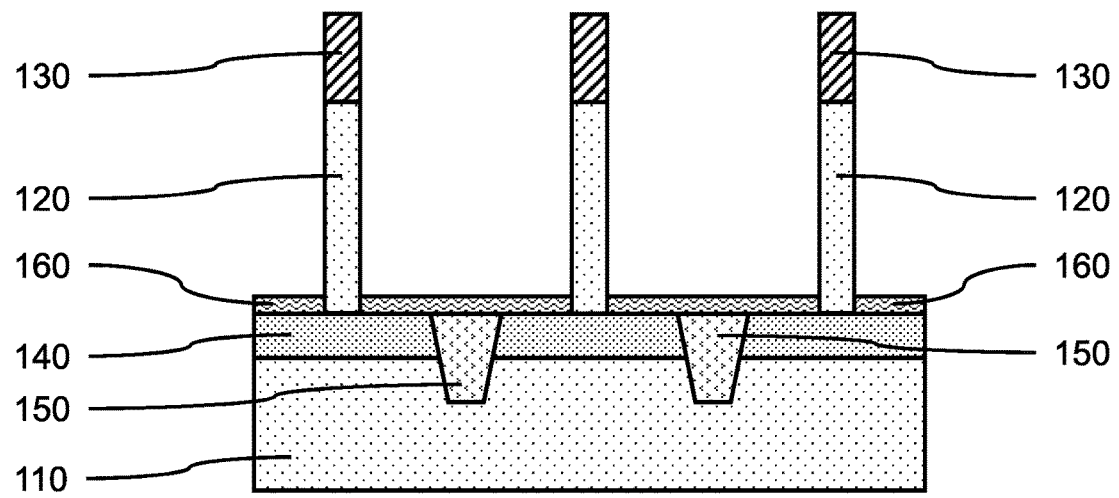
FIG. 1 is a cross-sectional side view showing a plurality of vertical fins on a substrate with isolation regions separating adjacent source/drain regions, in accordance with an embodiment of the present invention.

Referring now to the drawings in which like numerals represent the same or similar elements and initially to FIG. 1, a cross-sectional side view of a plurality of vertical fins on a substrate with isolation regions separating adjacent source/drain regions is shown, in accordance with an embodiment of the present invention.

In one or more embodiments, the substrate 110 can be a semiconductor substrate, where the semiconductor can be a type IV semiconductor (e.g., silicon (Si), germanium (Ge)), a IV-IV semiconductor (e.g., silicon-germanium (SiGe), silicon carbide (SiC), a III-V compound semiconductor (e.g., gallium arsenide (GaAs), indium phosphide (InP), indium-gallium arsenide (InGaAs), etc.). The semiconductor substrate 110 can be a single crystal that allows epitaxial growth on a crystalline face. In various embodiments, the substrate 110 can be a semiconductor-on-insulator substrate (SeOI).

In one or more embodiments, a plurality of vertical fins 120 can be formed on a substrate 110, where the vertical fins can be formed by epitaxial growth and/or directional etching, for example, by reactive ion etching (RIE). In various embodiments, the vertical fins 120 can be formed by an image transfer process, for example, a sidewall image transfer (SIT), also referred to as Self-Aligned Double Patterning (SADP), a Self-aligned triple patterning (SATP) process, a Self-Aligned Quadruple Patterning (SAQP) process, or a combination thereof. In various embodiments, the vertical fins 120 can be formed by a direct-write process, for example, using extreme ultraviolet (EUV) lithography, electron beam lithography, or x-ray lithography.

In one or more embodiments, the vertical fins 120 can have a width in a range of about 5 nanometers (nm) to about 10 nm, or about 6 nm to about 8 nm, although other widths are also contemplated. A plurality of vertical fins 120 can be arranged in rows and columns on the substrate 110, where a row of adjacent vertical fins can be separated by an isolation region 150.

In various embodiments, a fin template 130 can be formed on each of the vertical fins 120, where a fin template 120 can be formed on each of the vertical fins 120 from a fin template layer as part of the patterning process. In various embodiments, the fin templates 120 can be a hardmask material, for example, silicon oxide (SiO), silicon nitride (SiN), silicon oxynitride (SiON), silicon boronitride (SiBN), or a combination therefore.

In one or more embodiments, a bottom source/drain region 140 can be formed on the substrate 110, where the bottom source/drain region 140 can be formed by in-situ doped epitaxial growth, ion implantation, gas phase doping, plasma doping, plasma immersion ion implantation, cluster doping, infusion doping, liquid phase doping, solid phase doping, and/or any suitable combination of those techniques. In various embodiments, dopants are activated by thermal annealing, such as laser annealing, flash annealing, rapid thermal annealing (RTA) or any suitable combination of those techniques. Dopants can be n-type, for example, phosphorus (P) or arsenic (As), or p-type, for example, boron (B), or gallium (Ga), where the dopants can form an n-type FET or a p-type FET.

In one or more embodiments, an isolation region 150 can be formed between adjacent vertical fins 120, where the isolation region 150 can go through and separate the bottom source/drain region 140, such that vertical fins on different bottom source/drain regions 140 can be electrically isolated from adjacent vertical fins and bottom source/drain regions.

In one or more embodiments, a bottom spacer layer 160 can be formed on the exposed top surfaces of the bottom source/drain region 140 and isolation region(s) 150, where the bottom spacer layer 160 can be formed by a directional deposition, for example, a high density plasma (HDP) or gas cluster ion beam (GCIB) or a blanket deposition, for example, chemical vapor deposition (CVD) or plasma enhanced CVD (PECVD) and etch-back (e.g., RIE). An isotropic etch can be used to remove deposited material from the formation of the bottom spacer layer 160 from the sidewalls of the vertical fins 120.

In various embodiments, the bottom spacer layer 160 can be formed to a thickness in a range of about 4 nm to about 10 nm, or about 5 nm to about 7 nm, although other thicknesses are also contemplated. The bottom spacer layer 160 can cover a lower portion of the vertical fins 120.

In one or more embodiments, the bottom spacer layer 160 can be a dielectric material, including, but not limited to, silicon nitride (SiN), silicon oxynitride (SiON), silicon carbo-oxynitride (SiCON), and combinations thereof. The bottom spacer layer 160 can be the same or a different material from the fin templates 130 to provide etch selectivity.

Figure 2:
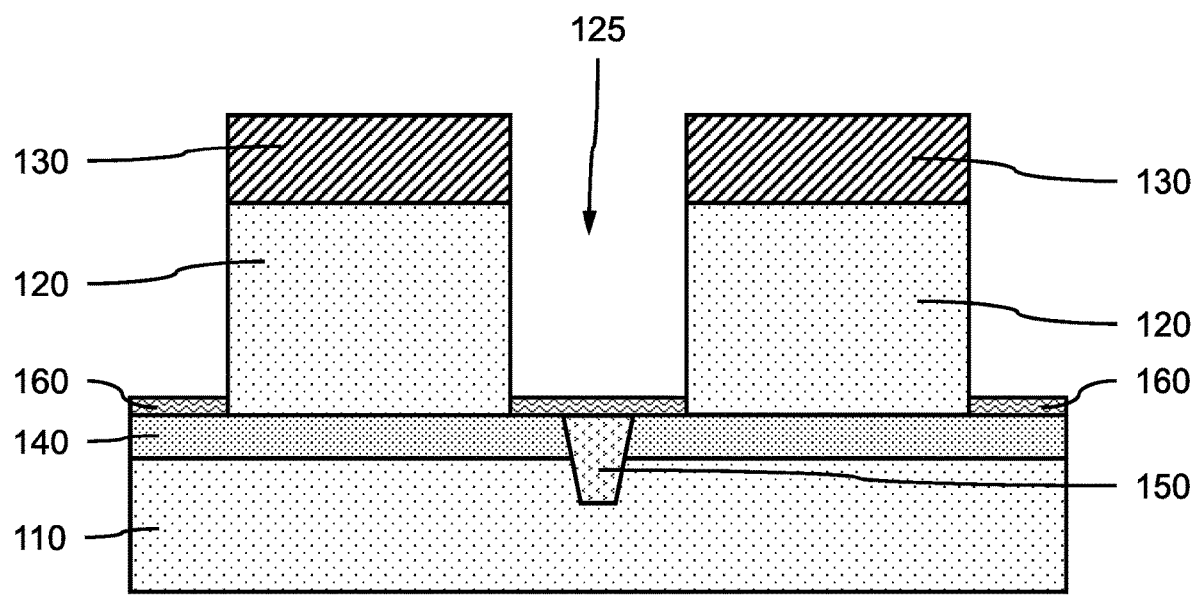
FIG. 2 is a cross-sectional side view along the long axis of the vertical fins showing the gap between adjacent vertical fins in the same column and a bottom spacer on the substrate, in accordance with an embodiment of the present invention.

FIG. 2 is a cross-sectional side view along the long axis of the vertical fins showing the gap between adjacent vertical fins in the same column and a bottom spacer on the substrate, in accordance with an embodiment of the present invention.

In one or more embodiments, a plurality of vertical fins 120 can be arranged in columns on the substrate 110, where a column of adjacent vertical fins 120 can be separated by a gap 125 and an isolation region 150. In various embodiments, the facing end walls of adjacent vertical fins can be separated by a gap with a width in a range of about 20 nanometers (nm) to about 200 nm, or about 30 nm to about 100 nm, or about 40 nm to about 70 nm, although other widths are also contemplated. The width of the gap 125 can be minimized to reduce the area on the substrate taken up by the plurality of vertical fins 120 and FinFETs. A portion of the bottom spacer layer 160 can be on the isolation region 150 and bottom source/drain region 140 between vertical fins in the same column, where the bottom spacer layer 160 can surround the plurality of vertical fins.

Figure 3:
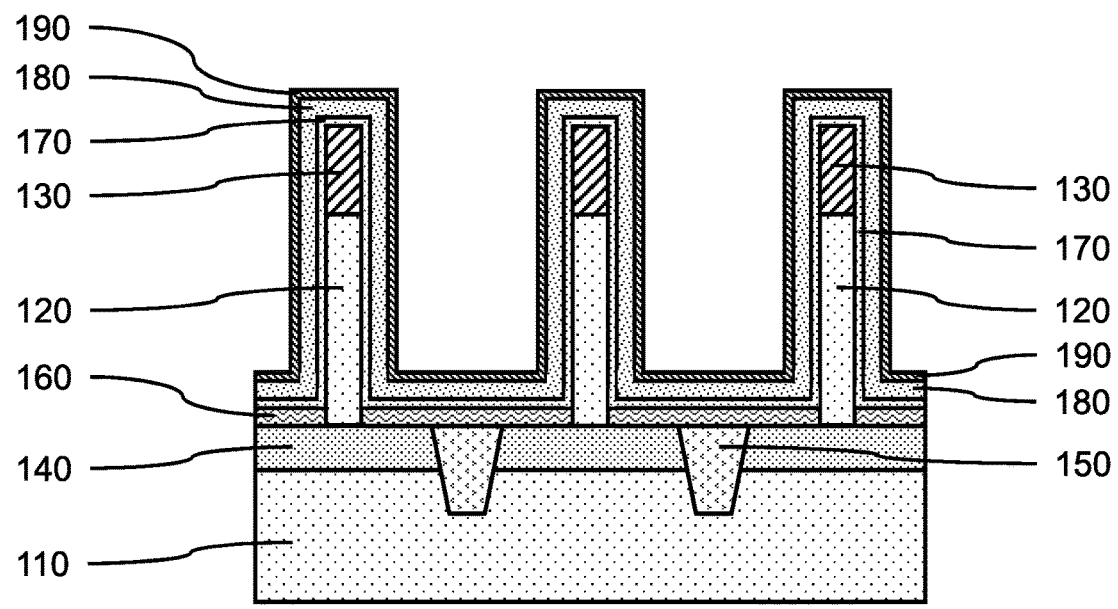
FIG. 3 is a cross-sectional side view showing a gate dielectric layer and work function material layer on the plurality of vertical fins, and a protective liner on the work function layer, in accordance with an embodiment of the present invention.

FIG. 3 is a cross-sectional side view showing a gate dielectric layer and work function material layer on the plurality of vertical fins, and a protective liner on the work function layer, in accordance with an embodiment of the present invention.

In one or more embodiments, a gate dielectric layer 170 can be formed on the exposed surfaces of the bottom spacer layer 160, plurality of vertical fins 120, and fin templates 130, where the gate dielectric layer 170 can be formed by a conformal deposition, for example, atomic layer deposition (ALD), plasma enhanced ALD (PEALD), low pressure chemical vapor deposition (LPCVD), or combinations thereof.

In various embodiments, the gate dielectric layer 170 can be formed to a thickness in a range of about 1 nm to about 5 nm, or about 2 nm to about 4 nm, although other thicknesses are also contemplated.

In various embodiments, the gate dielectric layer 170 can be silicon oxide (SiO), silicon nitride (SiN), a high-K dielectric material, or a combination thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In one or more embodiments, a work function material layer 180 can be formed on the gate dielectric layer 170 by a conformal deposition (e.g., ALD, PEALD). The work function material layer 180 can be formed by a conformal deposition (e.g., ALD, PEALD). In various embodiments, multiple work function material layers 180 can be formed on the gate dielectric layer 170. The gate dielectric layer 170 and the work function material layer 180 can form a gate structure on the vertical fins 120, where the gate dielectric layer 170 and the work function material layer 180 can surround each of the vertical fins on four sides.

In various embodiments, the work function material layer 180 can have a thickness in a range of about 1 nanometers (nm) to about 10 nm, or about 2 nm to about 5 nm, although other thicknesses are also contemplated.

In various embodiments, the work function material layers 180 can be a conducting metallic nitride or carbide compound material, for example, tantalum nitride (TaN), titanium nitride (TiN), tantalum carbide (TaC), titanium carbide (TiC), titanium aluminum carbide (TiAlC), and combinations thereof.

In one or more embodiments, a protective liner 190 can be formed on the exposed surface of the work function layer 180, where the protective liner can be formed by a conformal deposition (e.g., ALD, PEALD, LPCVD).

In various embodiments, the protective liner 190 can have a thickness in a range of about 2 nm to about 20 nm, or about 3 nm to about 10 nm, although other thicknesses are also contemplated. The protective liner 190 can be sufficiently thick to protect the work function layer 180 during subsequent etching processes.

In various embodiments, the protective liner 190 can be amorphous silicon (a-Si), a dielectric material, including, but not limited to, silicon boro carbonitride (SiBCN), silicon nitride (SiN), silicon oxynitride (SiON), silicon oxycarbide (SiOC), silicon carbo-oxynitride (SiCON), and combinations thereof. The material of the protective liner 190 can be compatible with the material of the work function layer 180, and selectively etchable relative to other layers.

Figure 4:
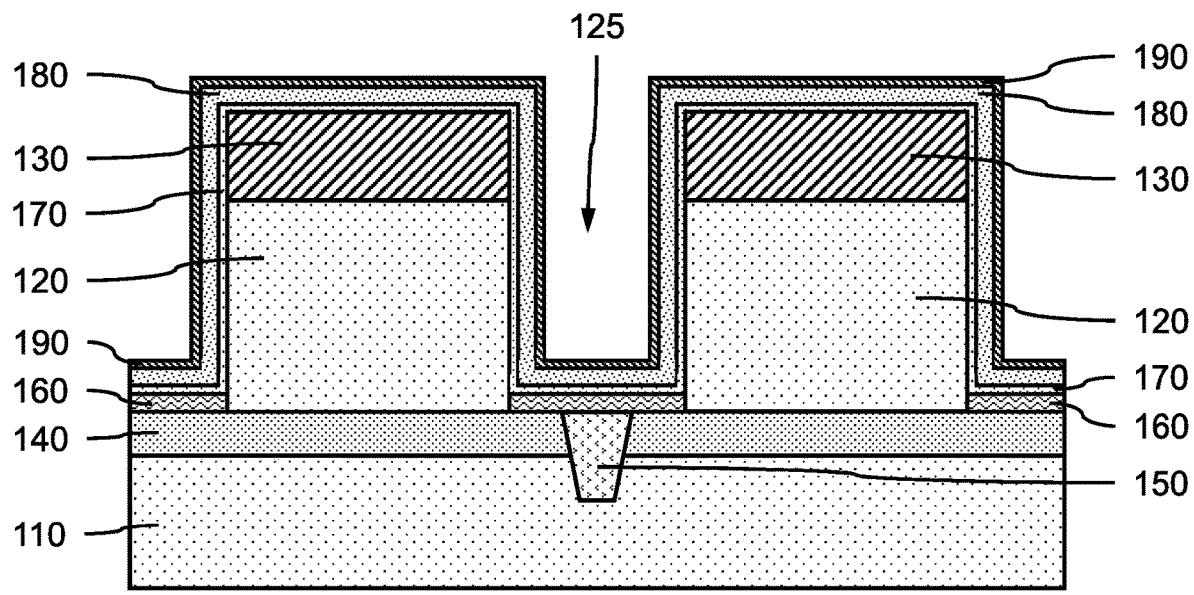
FIG. 4 is a cross-sectional side view along the long axis of the vertical fins showing the gate dielectric layer, work function layer, and protective liner, in accordance with an embodiment of the present invention.

FIG. 4 is a cross-sectional side view along the long axis of the vertical fins showing the gate dielectric layer, work function layer, and protective liner, in accordance with an embodiment of the present invention.

The combined thicknesses of the gate dielectric layer 170, work function material layer 180, and protective liner 190 on each of the adjacent vertical fins 120 in the same column can be less than the width of the gap 125, such that a portion of the gap 125 remains between the facing surfaces of the protective liner 190.

Figure 5:
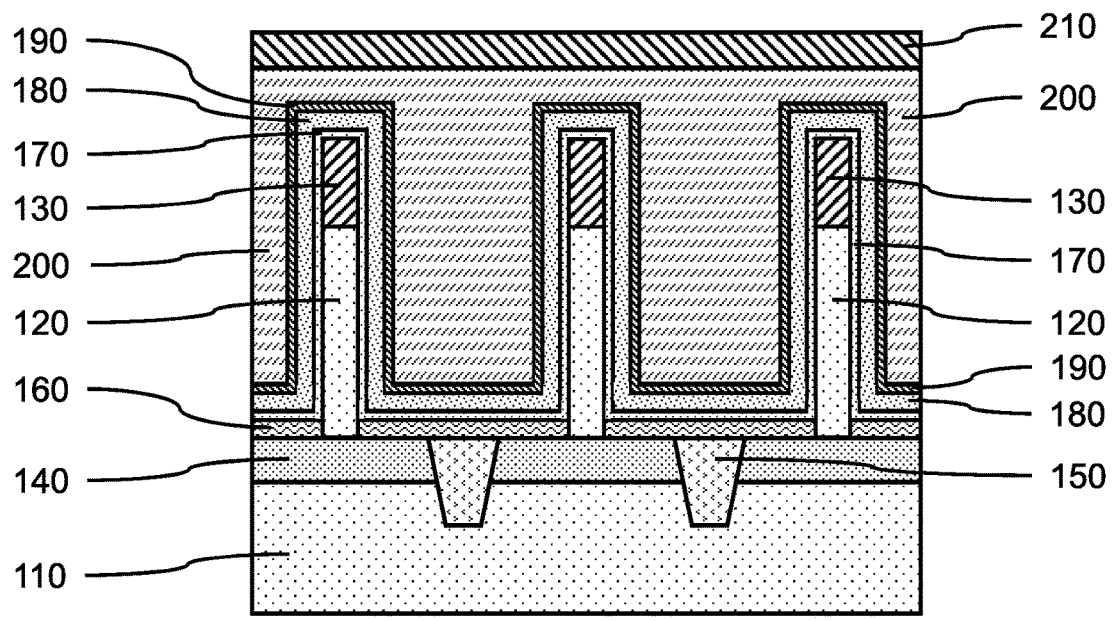
FIG. 5 is a cross-sectional side view showing a fill layer in the gaps between adjacent vertical fins in the same row and on the protective liner, and a hardmask layer on the fill layer, in accordance with an embodiment of the present invention.

FIG. 5 is a cross-sectional side view showing a fill layer in the gaps between adjacent vertical fins in the same row and on the protective liner, and a hardmask layer on the fill layer, in accordance with an embodiment of the present invention.

In one or more embodiments, a fill layer 200 can be formed on the protective liner 190, where the fill layer 200 can fill in the gaps 125. The fill layer 200 can be formed by a blanket deposition, for example, CVD, PECVD, a spin-on process, or combinations thereof.

In various embodiments, the fill layer 200 can be a dielectric material, including, but not limited to, an organic planarization layer (OPL) material, silicon oxide (SiO), a low-k dielectric material, and combinations thereof. A low-k dielectric material can include, but not be limited to, carbon doped silicon oxide (SiO:C), fluorine doped silicon oxide (SiO:F), a polymeric material, for example, tetraethyl orthosilicate (TEOS), hydrogen silsesquioxane (HSQ) and methylsilsesquioxane (MSQ), and combinations thereof. The material of the fill layer 200 can be different from the protective liner 190 to provide etch selectivity.

In one or more embodiments, a hardmask layer 210 can be formed on the top surface of the fill layer 200, where the hardmask layer 210 can be formed by a conformal or blanket deposition. In various embodiments, the hardmask layer 210 can be an amorphous silicon (a-Si), a spin-on glass, a hardmask material, for example, silicon oxide (SiO), silicon nitride (SiN), silicon oxynitride (SiON), silicon boronitride (SiBN), titanium oxide (TiO), titanium nitride (TiN), or a combination therefore. The hardmask layer 210 can be selectively removable from the fill layer 200 and protective liner 190.

Figure 6:
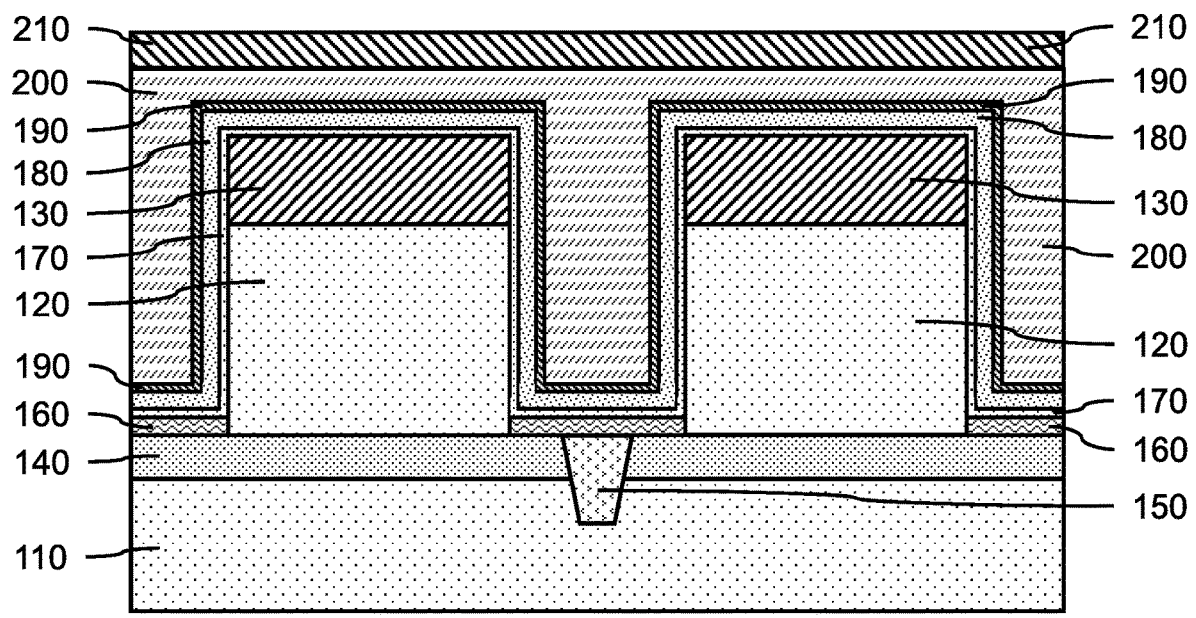
FIG. 6 is a cross-sectional side view along the long axis of the vertical fins showing the fill layer in the gap between adjacent vertical fins in the same column, and a hardmask layer on the fill layer, in accordance with an embodiment of the present invention.

FIG. 6 is a cross-sectional side view along the long axis of the vertical fins showing the fill layer in the gap between adjacent vertical fins in the same column, and a hardmask layer on the fill layer, in accordance with an embodiment of the present invention.

In various embodiments, the fill layer 200 can be formed on the protective liner 190 and fill in the remain space of the gap 125. The hardmask layer 210 can cover the fill layer over the gap.

Figure 7:
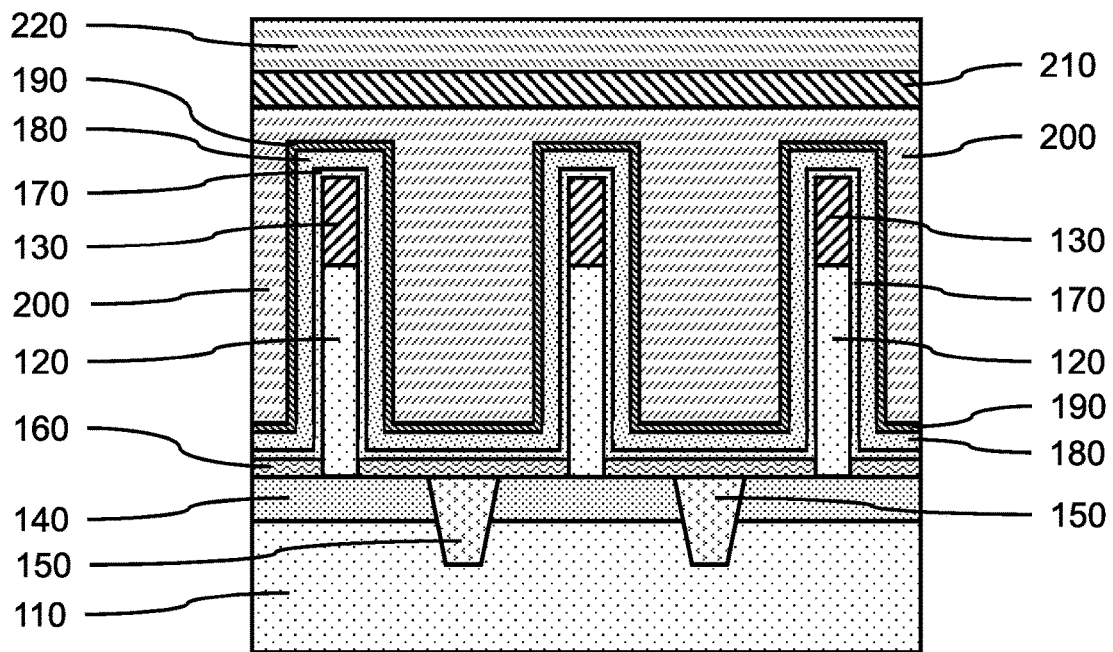
FIG. 7 is a cross-sectional side view showing a photoresist layer on the hardmask layer and fill layer, in accordance with an embodiment of the present invention.

FIG. 7 is a cross-sectional side view showing a photoresist layer on the hardmask layer and fill layer, in accordance with an embodiment of the present invention.

In one or more embodiments, a photo-resist layer 220 can be formed on the hardmask layer 210, where the photo-resist layer 220 can be patterned using lithographic techniques. The photo-resist layer 220 can be a positive or negative resist material.

Figure 8:
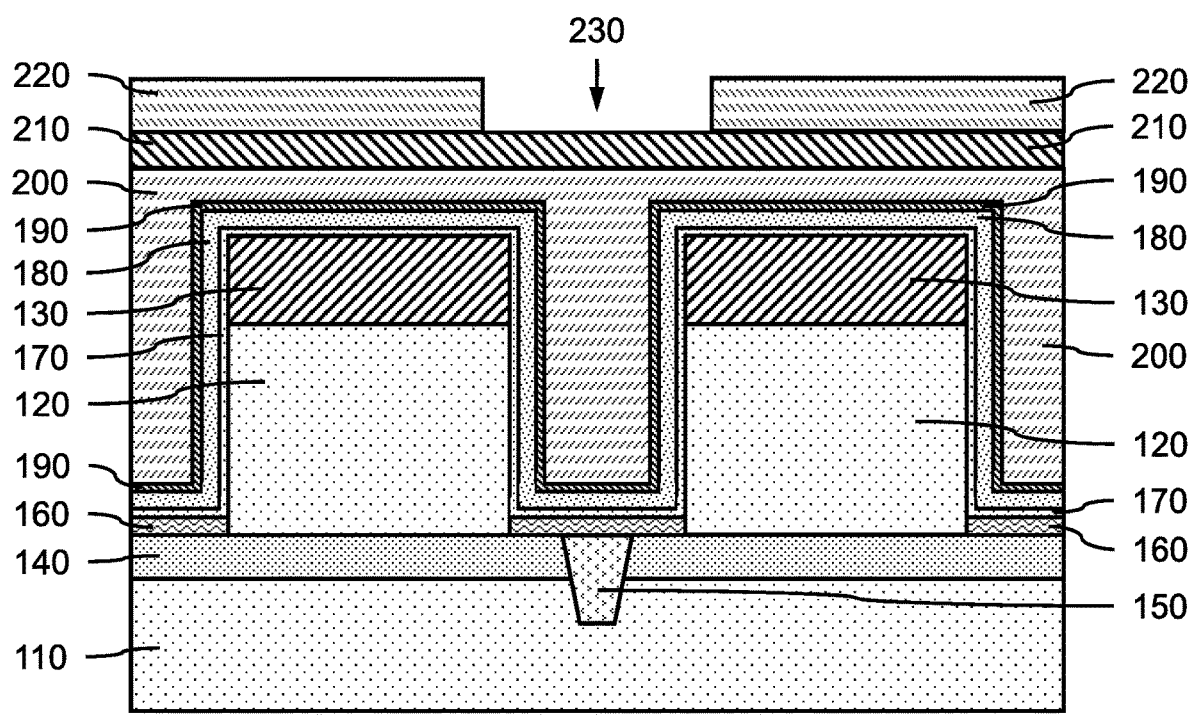
FIG. 8 is a cross-sectional side view along the long axis of the vertical fins showing an opening formed in the photoresist layer above the gap between adjacent vertical fins, in accordance with an embodiment of the present invention.

FIG. 8 is a cross-sectional side view along the long axis of the vertical fins showing an opening formed in the photoresist layer above the gap between adjacent vertical fins, in accordance with an embodiment of the present invention.

In one or more embodiments, the photo-resist layer 220 can be patterned to form an opening over the fill layer filled gap between adjacent vertical fins 120 in the same column, where the opening can expose a portion of the hardmask layer 210. The opening 230 can be wider than the initial width of the gap 125 to allow portions of the hardmask layer 210 and fill layer 200 over the fin templates 130 to be exposed and removed.

Figure 9:
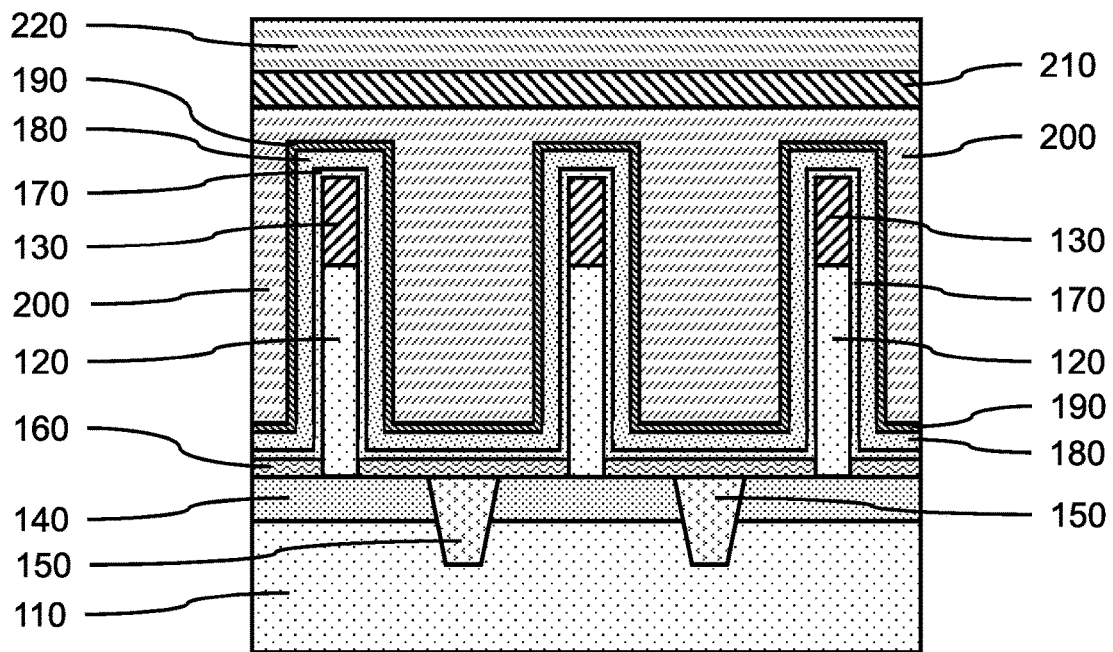
FIG. 9 is a cross-sectional side view showing the photoresist layer remaining on the hardmask layer above a portion of the vertical fins, in accordance with an embodiment of the present invention.

FIG. 9 is a cross-sectional side view showing the photo-resist layer remaining on the hardmask layer above a portion of the vertical fins, in accordance with an embodiment of the present invention.

In various embodiments, the photo-resist layer 220 and hardmask layer 210 can remain over certain portions of a plurality of vertical fins 120 in the same row, while the opening exposes other portions of a plurality of vertical fins 120 in the same row.

Figure 10:
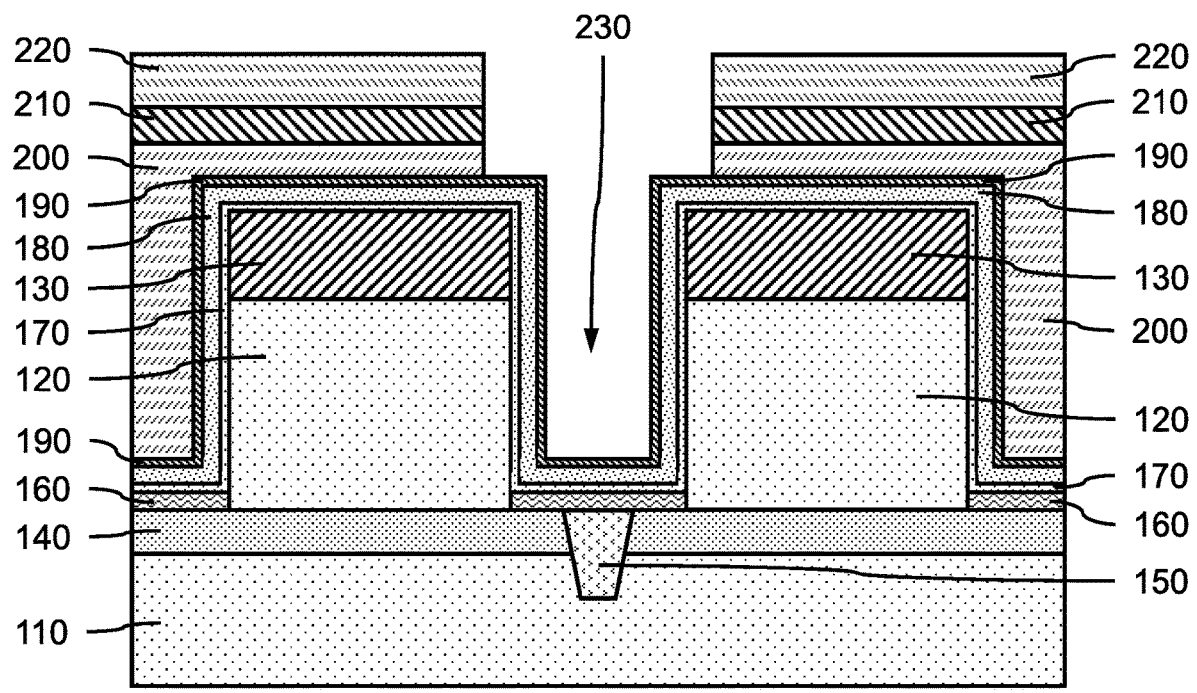
FIG. 10 is a cross-sectional side view along the long axis of the vertical fins showing the opening through the hardmask layer into the fill layer to expose a portion of the protective liner between adjacent vertical fins, in accordance with an embodiment of the present invention.

FIG. 10 is a cross-sectional side view along the long axis of the vertical fins showing the opening through the hardmask layer into the fill layer to expose a portion of the protective liner between adjacent vertical fins, in accordance with an embodiment of the present invention.

In one or more embodiments, the portion of the hardmask layer 210 exposed by the opening 230 in the photo-resist layer 220 can be removed, for example, using a selective, directional etch (e.g., RIE) to expose the underlying portion of the fill layer 200. The exposed portion of the fill layer can be removed using another selective, directional etch (e.g., RIE) to extend the opening 230 to the protective liner 190 and expose the protective liner 190 on edges of the fin templates 130 and over the isolation region 150 between adjacent vertical fins 120 in the same column. A portion of the exposed protective liner 190 can be above a portion of the adjacent vertical fins.

Figure 11:
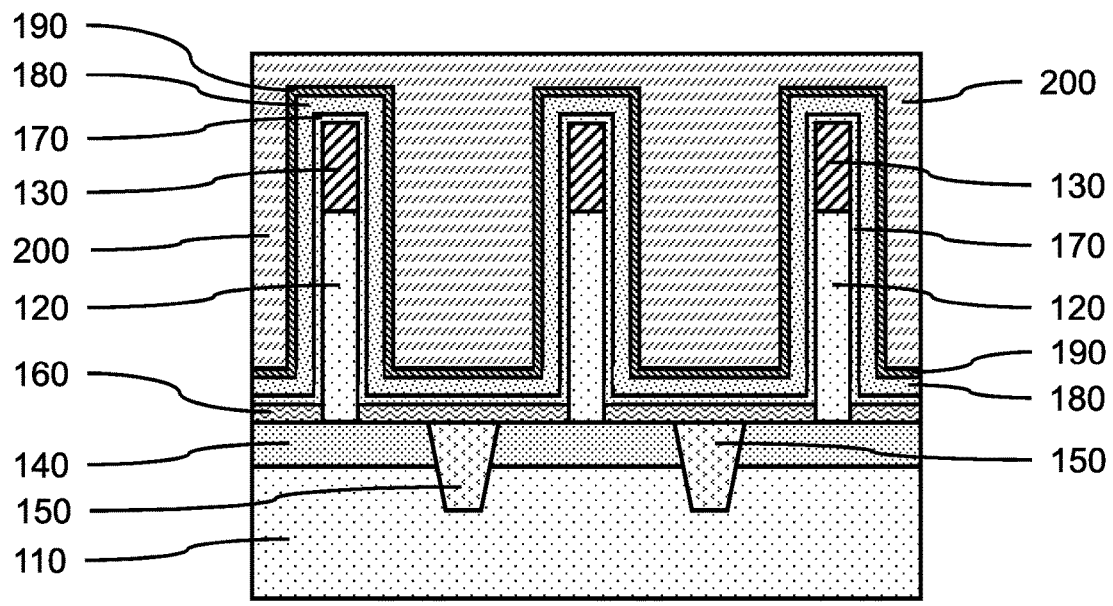
FIG. 11 is a cross-sectional side view showing the photoresist layer and the hardmask layer removed from the fill layer, in accordance with an embodiment of the present invention.

FIG. 11 is a cross-sectional side view showing the photoresist layer and the hardmask layer removed from the fill layer, in accordance with an embodiment of the present invention.

In one or more embodiments, the photoresist layer 220 and the hardmask layer 210 removed from the fill layer 200 after formation of the opening and exposure of the protective liner 190 between adjacent vertical fins 120.

Figure 12:
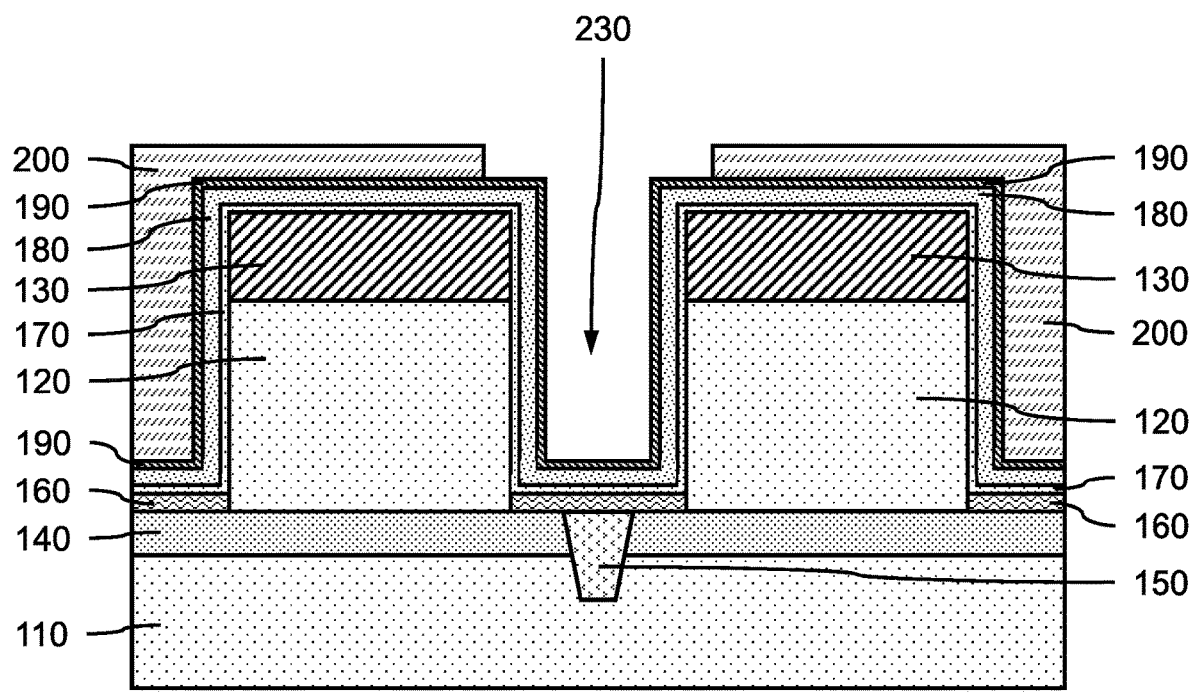
FIG. 12 is a cross-sectional side view along the long axis of the vertical fins showing the photoresist layer and the hardmask layer removed from the fill layer, in accordance with an embodiment of the present invention.

FIG. 12 is a cross-sectional side view along the long axis of the vertical fins showing the photoresist layer and the hardmask layer removed from the fill layer, in accordance with an embodiment of the present invention.

The photoresist layer 220 and the hardmask layer 210 can be removed to expose the portion of the fill layer 200 above the vertical fins 120 and between adjacent vertical fins in the same row.

Figure 13:
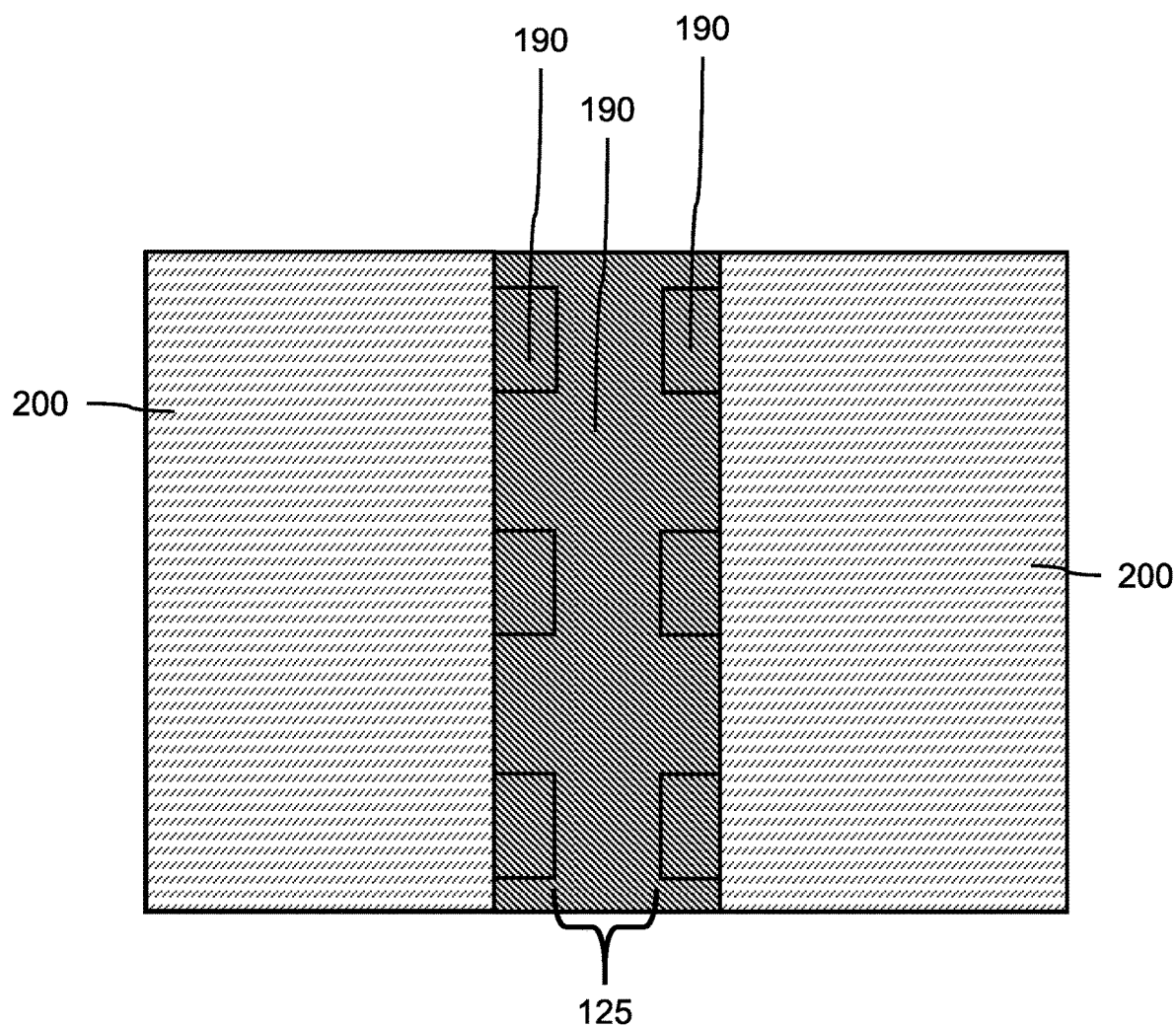
FIG. 13 is a top view showing the protective liner exposed by the opening in the fill layer, and covered portions of the covered vertical fins extending out from beneath the fill layer, in accordance with an embodiment of the present invention.

FIG. 13 is a top view showing the protective liner exposed by the opening in the fill layer, and covered portions of the covered vertical fins extending out from beneath the fill layer, in accordance with an embodiment of the present invention.

In one or more embodiments, portions of the protective liner 190 on a plurality of vertical fins 120 in the same rows and columns can be exposed by removing the portion of the fill layer. Portions of the protective liner 190 on the substrate in the remaining portions of the gaps 125 can also be exposed. The opening can extend across multiple columns of vertical fins, where the opening is over an end portion of each of the vertical fins 120.

Figure 14:
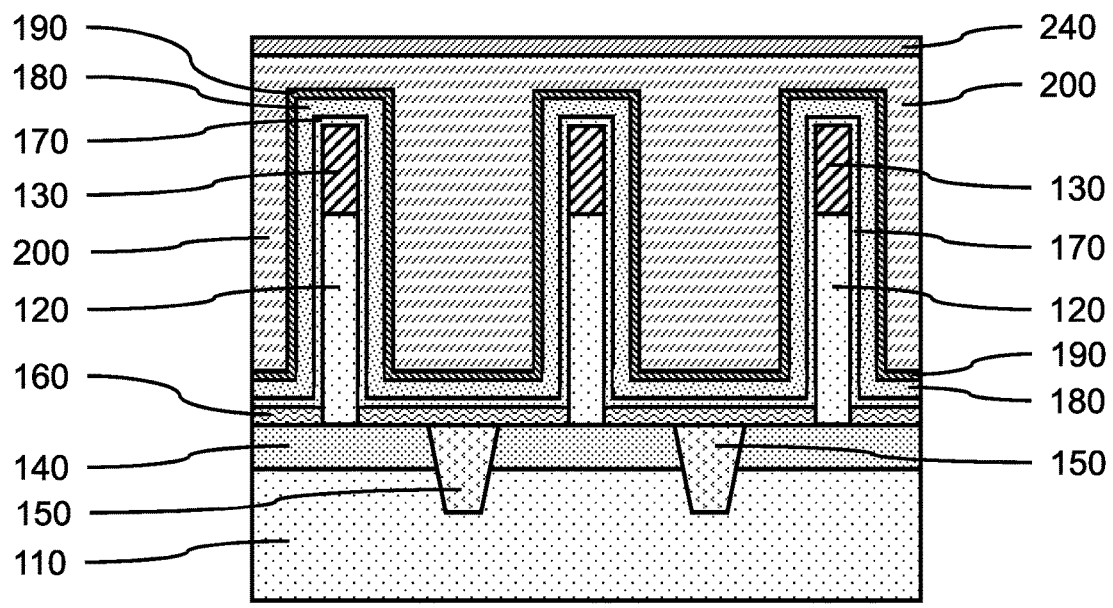
FIG. 14 is a cross-sectional side view showing an etch-stop layer formed on the fill layer, in accordance with an embodiment of the present invention.

FIG. 14 is a cross-sectional side view showing an etch-stop layer formed on the fill layer, in accordance with an embodiment of the present invention.

In one or more embodiments, an etch-stop layer 240 can be formed on the fill layer 200 and protective liner 190, where the etch-stop layer 240 can cover the surfaces in the gap 125. The etch-stop layer 240 can be formed by a conformal deposition (e.g., ALD, PEALD, LPCVD).

In various embodiments, the etch-stop layer 240 can be a dielectric material, including, but not limited to, silicon oxide (SiO), silicon carbide (SiC), silicon oxycarbide (SiOC), silicon nitride (SiN), silicon oxynitride (SiON), silicon carbo-oxynitride (SiCON), silicon boro carbonitride (SiBCN), and combinations thereof. The etch-stop layer 240 can be selectively etchable relative to the fill layer 200 and protective liner 190.

In various embodiments, the etch-stop layer 240 can have a thickness in a range of about 2 nm to about 20 nm, or about 3 nm to about 10 nm, although other thicknesses are also contemplated.

Figure 15:
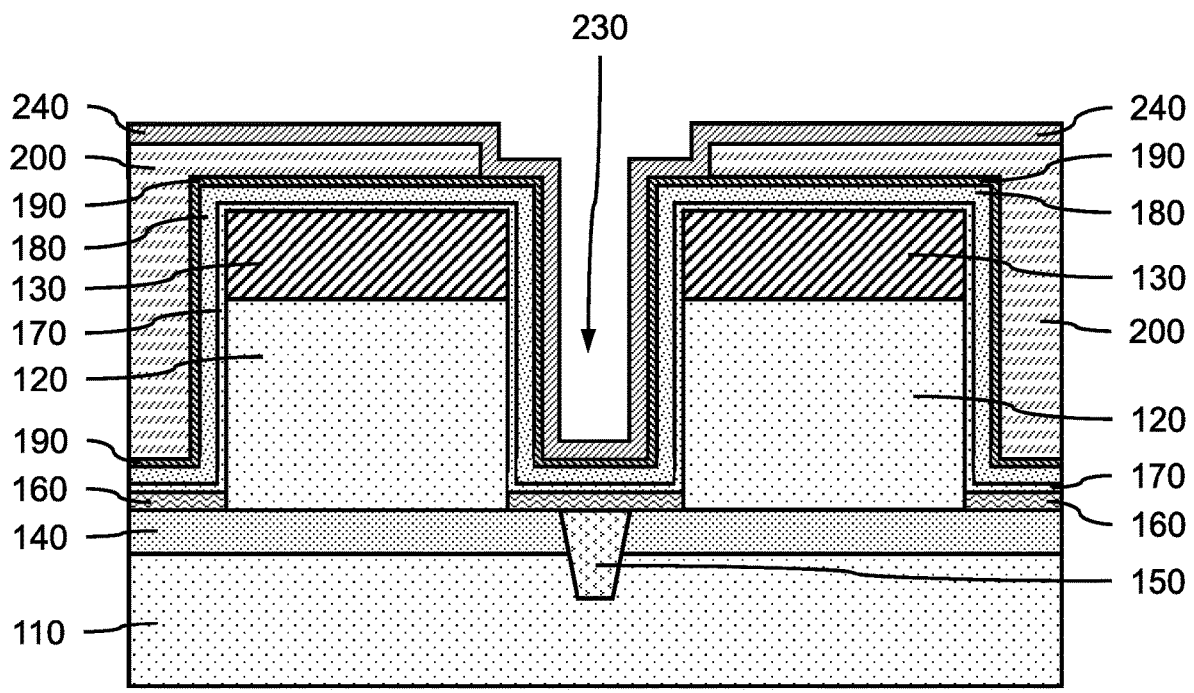
FIG. 15 is a cross-sectional side view along the long axis of the vertical fins showing the etch-stop layer formed on the fill layer and the protective liner exposed by the opening, in accordance with an embodiment of the present invention.

FIG. 15 is a cross-sectional side view along the long axis of the vertical fins showing the etch-stop layer formed on the fill layer and the protective liner exposed by the opening, in accordance with an embodiment of the present invention.

In various embodiments, the etch-stop layer 240 is formed on the protective liner 190 on the sidewalls of the vertical fins 120 and in the gap(s) 125, and covers the step between the protective liner 190 and the fill layer 200.

Figure 16:
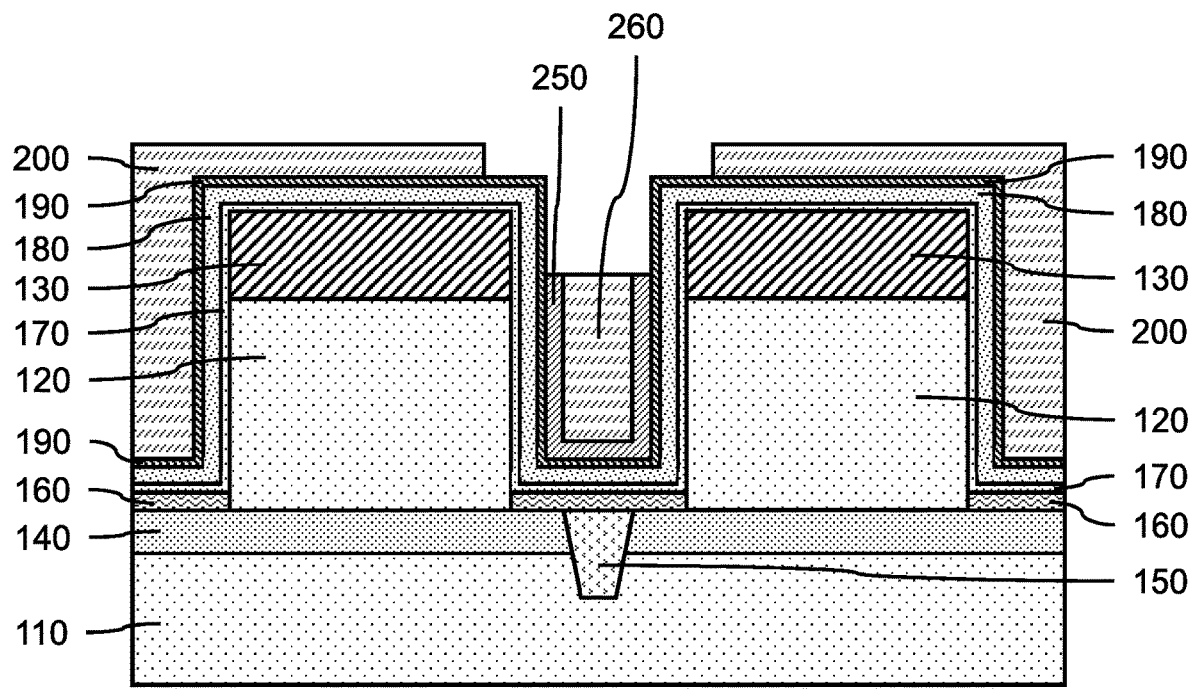
FIG. 16 is a cross-sectional side view along the long axis of the vertical fins showing a gauge layer formed on the etch-stop layer in the opening between adjacent vertical fins in the same column, where the portion of the etch-stop layer not covered by the gauge layer has been removed, in accordance with an embodiment of the present invention.

FIG. 16 is a cross-sectional side view along the long axis of the vertical fins showing a gauge layer formed on the etch-stop layer in the opening between adjacent vertical fins in the same column, where the portion of the etch-stop layer not covered by the gauge layer has been removed, in accordance with an embodiment of the present invention.

In one or more embodiments, a gauge layer 260 can be formed in the opening 230 on the etch-stop layer 240, where the gauge layer 260 can fill up a portion of the opening including the gap(s) 125. The gauge layer 260 can be formed to a predetermined height or can fill up the opening and then be etched back. The top surface of the gauge layer 260 can be formed to a height above the top surface of the vertical fins 120 but below the top surface of the fin templates 130, where the gauge layer 260 covers the portion of the etch-stop layer 240 in the opening 230.

In various embodiments, the gauge layer 260 can be a dielectric material, including, but not limited to, an organic planarization layer (OPL) material, silicon oxide (SiO), a low-k dielectric material, and combinations thereof. The gauge layer 260 and fill layer 200 can be the same dielectric material, so the gauge layer 260 and fill layer 200 can be removed using the same etch.

In one or more embodiments, the exposed portion of the etch-stop layer 240 can be removed using a selective isotropic etch, for example, a wet chemical etch or dry plasma etch. The portion of the etch-stop layer 240 can remaining in the bottom of the opening 230 to form an etch-stop segment 250 on the portion of the protective liner 190.

Figure 17:
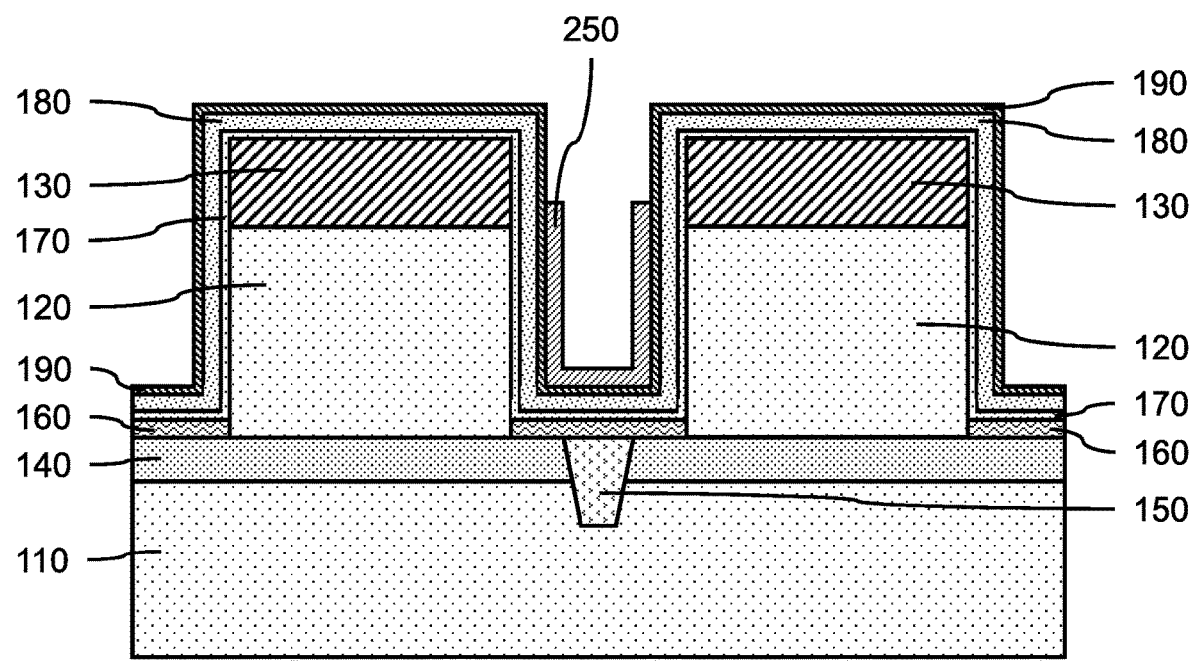
FIG. 17 is a cross-sectional side view along the long axis of the vertical fins showing the gauge layer and remaining portions of the fill layer removed to expose the protective liner, in accordance with an embodiment of the present invention.

FIG. 17 is a cross-sectional side view along the long axis of the vertical fins showing the gauge layer and remaining portions of the fill layer removed to expose the protective liner, in accordance with an embodiment of the present invention.

In one or more embodiments, the remaining portion(s) of the fill layer 200 can be removed with a selective isotropic etch, where the gauge layer 260 and fill layer 200 can be removed at the same time using the same selective etch. The etch-stop segment 250 can remain on the protion of the protective liner 190 in the bottom of the opening 230, whereas other portions of the protective liner 190 can be exposed by removal of the fill layer 200.

Figure 18:
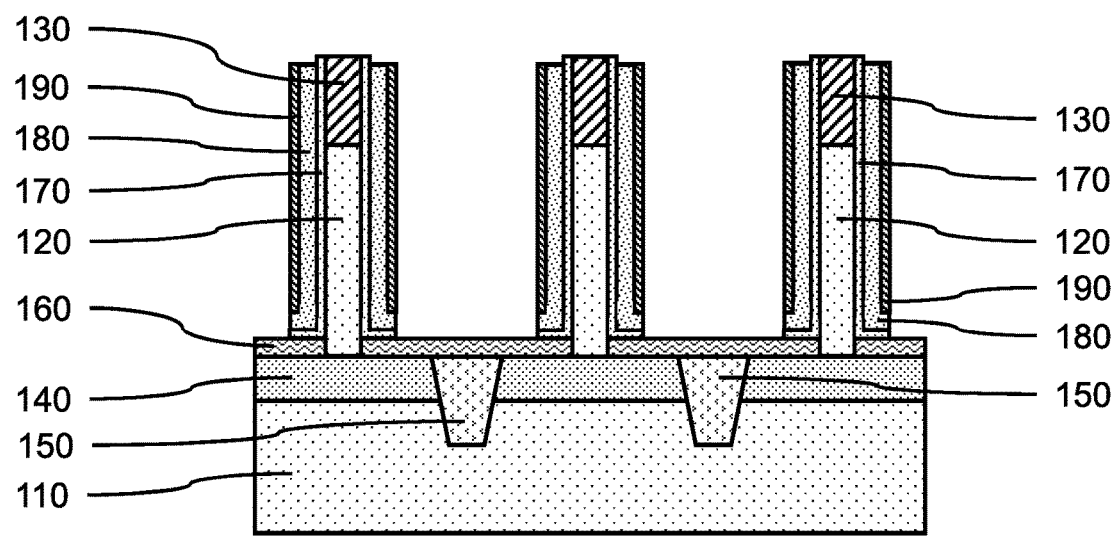
FIG. 18 is a cross-sectional side view showing portions of the protective liner, work function layer, and gate dielectric layer removed, and underlying portions of the bottom spacer layer exposed, in accordance with an embodiment of the present invention.

FIG. 18 is a cross-sectional side view showing portions of the protective liner, work function layer, and gate dielectric layer removed, and underlying portions of the bottom spacer layer exposed, in accordance with an embodiment of the present invention.

In one or more embodiments, the exposed portions of the protective liner 190 can be removed using a selective, directional etch (e.g., RIE) to expose the underlying portions of the work function material layer 180. Portions of the protective liner 190 can be removed from the tops of the fin templates 130.

In one or more embodiments, the exposed portions of the work function material layer 180 can be removed using a selective, directional etch (e.g., RIE) to expose the underlying portions of the gate dielectric layer 170. The exposed portions of the gate dielectric layer 170 can be removed using a selective, directional etch (e.g., RIE) to expose the underlying portions of the bottom spacer layer 160.

Figure 19:
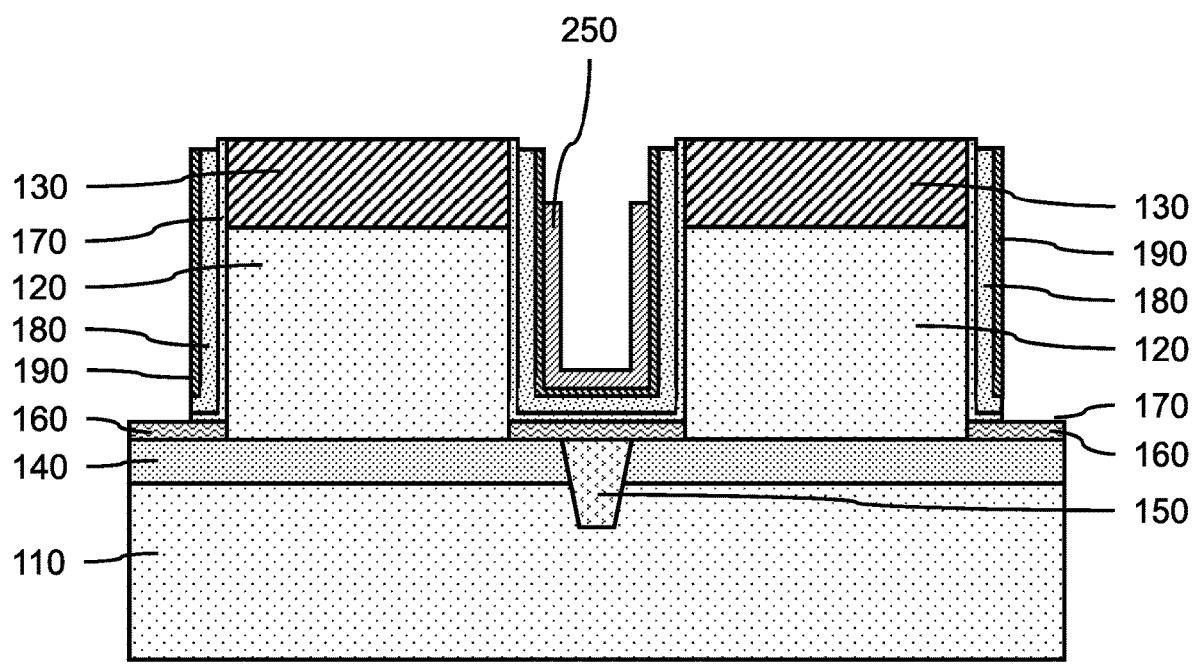
FIG. 19 is a cross-sectional side view along the long axis of the vertical fins showing portions of the protective liner, work function layer, and gate dielectric layer removed, and underlying portions of the bottom spacer layer exposed, in accordance with an embodiment of the present invention.

FIG. 19 is a cross-sectional side view along the long axis of the vertical fins showing portions of the protective liner, work function layer, and gate dielectric layer removed, and underlying portions of the bottom spacer layer exposed, in accordance with an embodiment of the present invention.

In various embodiments, portions of the protective liner 190, work function layer 180, and gate dielectric layer 170 covered by the etch-stop segment 250 can remain on the end walls of the vertical fins 120 in the opening 230. Portions of the protective liner 190, work function layer 180, and gate dielectric layer 170 can also remain on the end walls of the vertical fins 120 due to the nature of the directional etch(es).

Figure 20:
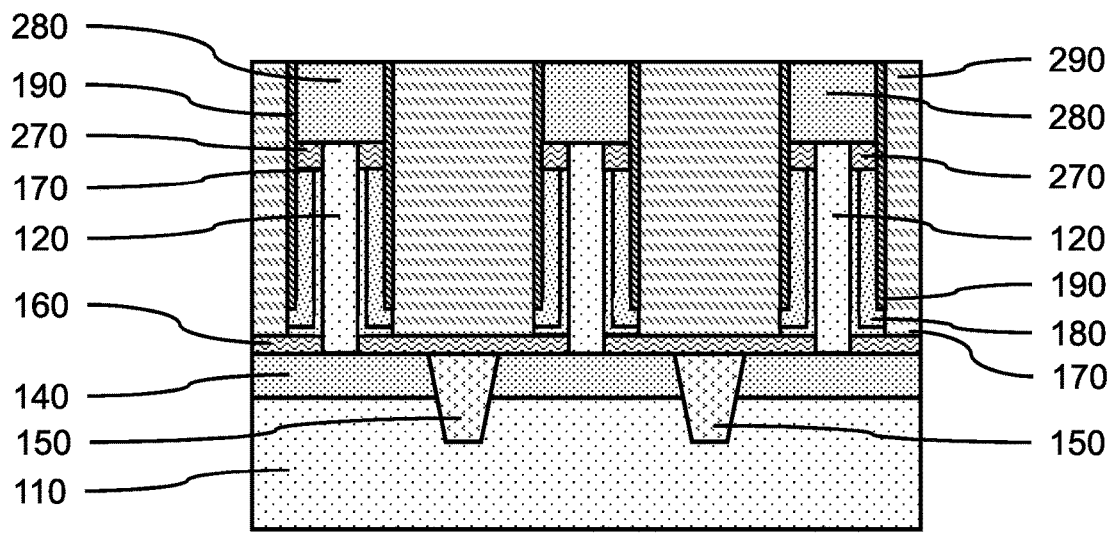
FIG. 20 is a cross-sectional side view showing the fin templates replaced by top source/drains, and an interlayer dielectric layer formed on the bottom spacer layer, in accordance with an embodiment of the present invention.

FIG. 20 is a cross-sectional side view showing the fin templates replaced by top source/drains, and an interlayer dielectric layer formed on the bottom spacer layer, in accordance with an embodiment of the present invention.

In one or more embodiments, the fin templates 130 can be removed to expose the top edges of the work function layer 180 and gate dielectric layer 170, where the fin templates 130 can be removed using a selective etch. Portions of the work function layer 180 and gate dielectric layer 170 can be removed to reduce the heights of the work function layer 180 and gate dielectric layer 170 to below the top surface of the vertical fins 120.

In one or more embodiments, a top spacer 270 can be formed in the spaces left be etching back the work function layer 180 and gate dielectric layer 170. The top spacers 270 can be formed by a deposition and etch-back. In various embodiments, the top spacers 270 can be a dielectric material, including, but not limited to, silicon nitride (SiN), silicon oxynitride (SiON), silicon carbo-oxynitride (SiCON), and combinations thereof. The top spacer 270 can be the same material as the bottom spacer layer 160.

In one or more embodiments, the fin templates 130 replaced by top source/drains 280, where the top source/drains 280 can be formed by epitaxial growth on the exposed top surfaces of the vertical fins 120 after removing the fin templates 130.

In various embodiments, the top source/drains 280 can be semiconductor material doped with an n-type dopant (e.g., phosphorus (P), arsenic (As), etc.) or a p-type dopant (e.g., boron (B), gallium (Ga), etc.). In various embodiments, the top source/drains 280 can be the same semiconductor material as the bottom source/drain region 140, and may have the same dopant type as the bottom source/drain layer. In a non-limiting exemplary embodiment, the top source/drain(s) 210 can be phosphorus-doped silicon (Si:P) to form an n-type FinFET or a boron-doped silicon germanium (SiGe:B) to form a p-type FinFET.

An interlayer dielectric (ILD) layer 290 can be formed on the bottom spacer layer 160 exposed by etching back the protective liner 190, work function layer 180, and gate dielectric layer 170. In various embodiments, the interlayer dielectric (ILD) layer 290 can be a dielectric material, including, but not limited to, silicon oxide (SiO), a low-k dielectric material, and combinations thereof.

Figure 21:
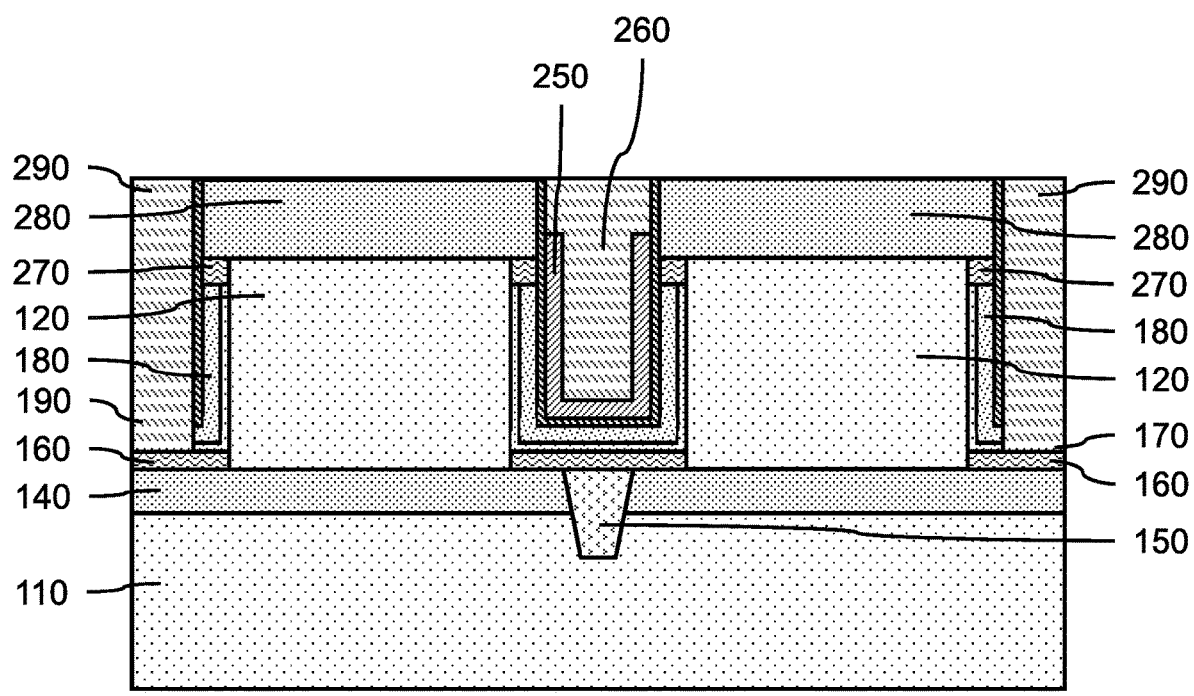
FIG. 21 is a cross-sectional side view along the long axis of the vertical fins showing the interlayer dielectric layer formed on the etch-stop layer and bottom spacer layer, in accordance with an embodiment of the present invention.

FIG. 21 is a cross-sectional side view along the long axis of the vertical fins showing the interlayer dielectric layer formed on the etch-stop layer and bottom spacer layer, in accordance with an embodiment of the present invention.

In various embodiments, the ILD layer 290 can cover the etch-stop segment 250 and a portion of the protective liner 190 on the top source/drains 280.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming adjacent fin field effect transistor devices, comprising:
    forming at least two vertical fins in a column on a substrate;
    depositing a gate dielectric layer on the at least two vertical fins;
    depositing a work function material layer on the gate dielectric layer;
    depositing a protective liner on the work function material layer;
    forming a fill layer on the protective liner;
    removing a portion of the fill layer to form an opening between an adjacent pair of the at least two vertical fins, wherein the opening exposes a portion of the protective liner;
    depositing an etch-stop layer on exposed surfaces of the fill layer and the exposed portion of the protective liner;
    forming a gauge layer on the etch-stop layer in the opening to a predetermined height including a portion of the etch-stop layer exposed above a top surface of the gauge layer; and
    removing the exposed portion of the etch-stop layer to form an etch-stop segment in the opening; and
    removing the gauge layer from the etch stop segment.

2. The method of claim 1, further comprising, removing the fill layer, wherein the gauge layer and fill layer are removed with a single etch.

3. The method of claim 2, further comprising, removing portions of the protective liner, portions of the work function material layer, and portions of the gate dielectric layer.

4. The method of claim 3, further comprising, forming a top source/drain on each of the adjacent pair of the at least two vertical fins.

5. The method of claim 4, further comprising, forming an interlayer dielectric layer on the substrate.

6. The method of claim 4, wherein the etch-stop layer is a dielectric material selected from the group consisting of silicon oxide (SiO), silicon carbide (SiC), silicon oxycarbide (SiOC), silicon nitride (SiN), silicon oxynitride (SiON), silicon carbo-oxynitride (SiCON), silicon boro carbonitride (SiBCN), and combinations thereof.

7. The method of claim 4, wherein the adjacent pair of the at least two vertical fins are separated by a gap with a width in a range of about 20 nanometers (nm) to about 200 nm.

8. The method of claim 4, wherein the protective liner has a thickness in a range of about 2 nanometers (nm) to about 20 nm.

9. The method of claim 4, wherein the protective liner is dielectric material selected from the group consisting of silicon boro carbonitride (SiBCN), silicon nitride (SiN), silicon oxynitride (SiON), silicon carbo-oxynitride (SiCON), and combinations thereof.

10. A method of forming adjacent fin field effect transistor devices, comprising:
    forming at least two vertical fins in a column on a substrate;
    forming a source/drain region below each of the at least two vertical fins;
    forming a bottom spacer layer on the substrate;
    depositing a gate dielectric layer on the at least two vertical fins and bottom spacer layer;
    depositing a work function material layer on the gate dielectric layer;
    depositing a dielectric protective liner on the work function material layer;
    forming a fill layer on the protective liner;
    removing a portion of the fill layer to form an opening between an adjacent pair of the at least two vertical fins, wherein the opening exposes a portion of the protective liner;
    depositing an etch-stop layer on the exposed surfaces of the fill layer and the exposed portion of the protective liner;
    forming a gauge layer on the etch-stop layer in the opening to a predetermined height including a portion of the etch-stop layer exposed above a top surface of the gauge layer;
    removing the exposed portion of the etch-stop layer to form an etch-stop segment in the opening; and
    forming a top source/drain on a top surface of each of the adjacent pair of the at least two vertical fins.

11. The method of claim 10, wherein the adjacent pair of the at least two vertical fins are separated by a gap with a width in a range of about 20 nanometers (nm) to about 200 nm.

12. The method of claim 10, wherein the etch-stop layer is a dielectric material selected from the group consisting of silicon oxide (SiO), silicon carbide (SiC), silicon oxycarbide (SiOC), silicon nitride (SiN), silicon oxynitride (SiON), silicon carbo-oxynitride (SiCON), silicon boro carbonitride (SiBCN), and combinations thereof.

13. The method of claim 10, wherein the protective liner is a dielectric material selected from the group consisting of silicon boro carbonitride (SiBCN), silicon nitride (SiN), silicon oxynitride (SiON), silicon carbo-oxynitride (SiCON), and combinations thereof.

14. The method of claim 10, wherein the etch-stop layer can have a thickness in a range of about 2 nm to about 20 nm.

15. A method of forming adjacent fin field effect transistor devices, comprising:
    depositing a gate dielectric layer on at least two vertical fins aligned in a column;
    depositing a work function material layer on the gate dielectric layer;
    depositing a protective liner on the work function material layer, wherein the protective liner is made of amorphous silica (a-Si) or a dielectric material;
    forming a dielectric fill layer on the protective liner;
    removing a portion of the dielectric fill layer to form an opening between an adjacent pair of the at least two vertical fins, wherein the opening exposes a portion of the protective liner;
    depositing an etch-stop layer on exposed surfaces of the fill layer and the exposed portion of the protective liner; and forming a dielectric gauge layer on the etch-stop layer in the opening to a predetermined height including a portion of the etch-stop layer exposed above a top surface of the gauge layer.

16. The method of claim 15, wherein the etch-stop layer covers a step between the protective liner and the fill layer.

17. The method of claim 15, further comprising removing the exposed portion of the etch-stop layer to form an etch-stop segment in the opening.

18. The method of claim 17, wherein the dielectric gauge layer and the dielectric fill layer are made of the same dielectric material.

19. The method of claim 18, wherein the dielectric gauge layer and the dielectric fill layer are removed with a single etch.

20. The method of claim 17, further comprising removing the dielectric gauge layer from the etch stop segment, and removing portions of the dielectric protective liner, work function layer, and gate dielectric layer from the at least two vertical fins aligned in a column.

* * * * *